(12) United States Patent
Brueck et al.

(10) Patent No.: US 9,905,746 B2
(45) Date of Patent: Feb. 27, 2018

(54) METHOD FOR PRODUCING A THERMOELECTRIC COMPONENT, THERMOELECTRIC COMPONENT AND MOTOR VEHICLE

(71) Applicant: EMITEC GESELLSCHAFT FUER EMISSIONSTECHNOLOGIE MBH, Lohmar (DE)

(72) Inventors: Rolf Brueck, Bergisch Gladbach (DE); Sigrid Limbeck, Much (DE)

(73) Assignee: EMITEC Gesellschaft fuer Emissionstechnologie mbH, Lohmar (DE)

( * ) Notice: Subject to any disclaimer, the term of this patent is extended or adjusted under 35 U.S.C. 154(b) by 484 days.

(21) Appl. No.: 14/559,970

(22) Filed: Dec. 4, 2014

(65) Prior Publication Data

US 2015/0145373 A1 May 28, 2015

Related U.S. Application Data

(63) Continuation of application No. PCT/EP2013/061217, filed on May 31, 2013.

(30) Foreign Application Priority Data

Jun. 4, 2012 (DE) .................. 10 2012 104 809

(51) Int. Cl.
*H02N 10/00* (2006.01)
*H01L 35/34* (2006.01)
(Continued)

(52) U.S. Cl.
CPC .............. *H01L 35/34* (2013.01); *F01N 5/025* (2013.01); *H01L 35/26* (2013.01); *H02N 11/002* (2013.01); *Y02T 10/16* (2013.01); *Y10T 29/49002* (2015.01)

(58) Field of Classification Search
CPC .......... H01L 35/34; H02N 3/00; H02N 10/00; Y10T 29/49002
(Continued)

(56) References Cited

U.S. PATENT DOCUMENTS 5,228,923 A 7/1993 Hed
8,378,206 B2 2/2013 Schuette et al.
(Continued)

FOREIGN PATENT DOCUMENTS

CN 101389792 A 3/2009
CN 102245871 A 11/2011
(Continued)

OTHER PUBLICATIONS

Li D et al.: "Electrospinning of Polymeric and Ceramic Nanofibers as Uniaxially Aligned Arrays", NANO LETTERS, American Chemical Society, US, vol. 3, No. 8, Aug. 2003 (Aug. 7, 2003), pp. 1167-1171, XP008052133, ISSN: 1530-6984, DOI: 10.1021/NL0344256.

*Primary Examiner* — Hanh Nguyen
(74) *Attorney, Agent, or Firm* — Laurence A. Greenberg; Werner H. Stemer; Ralph E. Locher

(57) ABSTRACT

A method for producing a thermoelectric component includes coating at least one fiber with thermoelectric material. The thermoelectric component has an annular configuration and the coated fiber extends in a circumferential direction over an angular range of at least 120°. A thermoelectric component and a motor vehicle having a thermoelectric component are also provided.

6 Claims, 2 Drawing Sheets

(51) Int. Cl.
*H02N 11/00* (2006.01)
*F01N 5/02* (2006.01)
*H01L 35/26* (2006.01)

(58) Field of Classification Search
USPC ......... 310/306, 309; 136/208, 209; 29/592.1
See application file for complete search history.

(56) References Cited

U.S. PATENT DOCUMENTS

| | | |
|---|---|---|
| 8,713,924 B2 | 5/2014 | Brueck et al. |
| 9,184,365 B2 | 11/2015 | Limbeck et al. |
| 9,209,377 B2 | 12/2015 | Brueck et al. |
| 2008/0017238 A1 | 1/2008 | Fei et al. |
| 2008/0121263 A1 | 5/2008 | Schutte et al. |
| 2008/0169016 A1* | 7/2008 | Dutta ................ H01L 31/03528 136/238 |
| 2008/0173344 A1* | 7/2008 | Zhang ..................... H01L 35/16 136/238 |
| 2009/0004086 A1 | 1/2009 | Kuhling et al. |
| 2011/0139207 A1 | 6/2011 | Edwards |
| 2011/0314798 A1* | 12/2011 | Limbeck ................. F01N 5/025 60/320 |
| 2012/0177864 A1 | 7/2012 | Limbeck et al. |
| 2013/0305743 A1* | 11/2013 | Poelloth .................. H01L 35/30 62/3.3 |

FOREIGN PATENT DOCUMENTS

| | | | |
|---|---|---|---|
| CN | 102318097 A | | 1/2012 |
| CN | 102593342 A | * | 7/2012 ............. H01L 35/34 |
| DE | 102006055120 A1 | | 5/2008 |
| DE | 102010030259 A1 | | 12/2011 |
| DE | 102011008377 A1 | | 7/2012 |
| JP | 2000294840 A | | 10/2000 |
| JP | 2002141562 A | | 5/2002 |
| JP | 2009522454 A | | 6/2009 |
| KR | 20080106504 A | | 12/2008 |
| SU | 169620 A1 | | 6/1965 |
| WO | 2012031881 A1 | | 3/2012 |

* cited by examiner

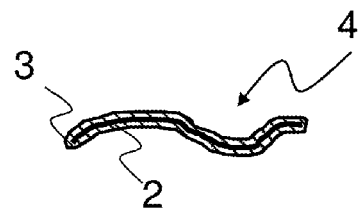
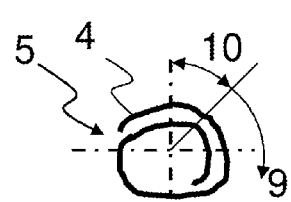
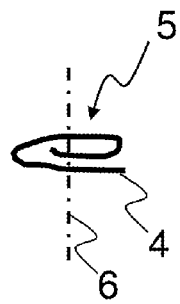
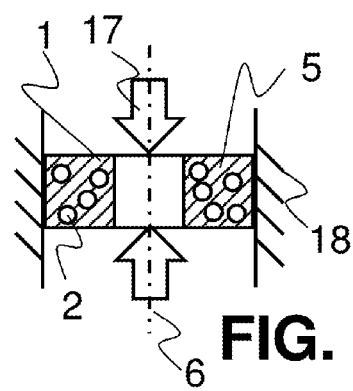
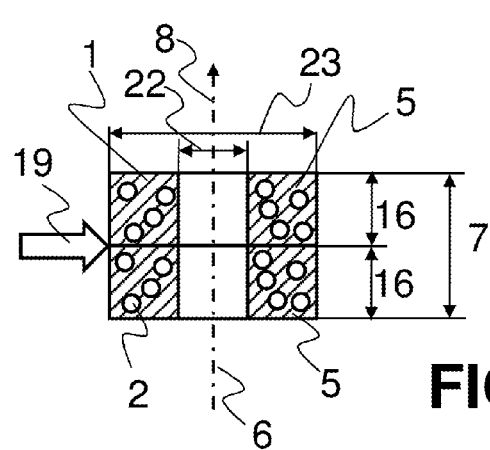

METHOD FOR PRODUCING A THERMOELECTRIC COMPONENT, THERMOELECTRIC COMPONENT AND MOTOR VEHICLE

CROSS-REFERENCE TO RELATED APPLICATION

This is a continuation, under 35 U.S.C. § 120, of copending International Application No. PCT/EP2013/061217, filed May 31, 2013, which designated the United States; this application also claims the priority, under 35 U.S.C. § 119, of German Patent Application DE 10 2012 104 809.6, filed Jun. 4, 2012; the prior applications are herewith incorporated by reference in their entirety.

BACKGROUND OF THE INVENTION

Field of the Invention

The present invention relates to a method for producing a thermoelectric component, a thermoelectric component and a motor vehicle having a thermoelectric component.

Thermoelectric modules are used individually or in large numbers as a thermoelectric generator which generates electrical energy from a temperature potential and from a resulting heat flow. The electrical energy is generated on the basis of the so-called Seebeck effect. Thermoelectric modules are constructed from electrically interconnected p-doped and n-doped thermoelectric components. The thermoelectric components have a so-called hot side and an oppositely disposed cold side by which they are connected, in each case in electrically conductive fashion, in alternating fashion to adjacently disposed further thermoelectric components. In that case, the hot side is connected in thermally conductive fashion to a wall, which is impinged on by a hot medium (for example exhaust gas), of the thermoelectric module. Correspondingly, the cold side of the thermoelectric component is connected in thermally conductive fashion to another wall, which is impinged on by a cold medium (for example cooling water), of the thermoelectric module.

Thermoelectric generators are used, in particular, in motor vehicles but also in other technical fields in which a temperature potential can be utilized, through the configuration of thermoelectric generators, for the generation of electrical energy.

During the operation of a thermoelectric generator, thermoelectric components are exposed to temperature potentials, in such a way that a heat flow passes between a hot side and a cold side of the thermoelectric component for the purpose of generating electrical energy. Furthermore, the thermoelectric components are exposed to fluctuating thermal stresses that result from fluctuating temperature values at the hot side and at the cold side. That loading can result in failure of the thermoelectric component, in such a way that the effectiveness of the conversion of thermal energy into electrical energy is at least reduced.

SUMMARY OF THE INVENTION

It is accordingly an object of the invention to provide a method for producing a thermoelectric component, a thermoelectric component and a motor vehicle, which overcome the hereinafore-mentioned disadvantages and at least partially solve the highlighted problems of the heretofore-known methods, components and vehicles of this general type. In particular, it is sought to specify a method for producing a thermoelectric component, with which a thermoelectric component can be provided that is durable and robust with regard to fluctuating thermal stresses. Furthermore, it is sought to propose a corresponding thermoelectric component which is constructed in such a way that it can durably withstand corresponding loads.

With the foregoing and other objects in view there is provided, in accordance with the invention, a method for producing a thermoelectric component which comprises at least the following steps:

a) providing at least one fiber, b) coating the at least one fiber with a thermoelectric material in such a way that at least one coated fiber is formed, c) at least winding the at least one coated fiber to form a ring with a central axis, and d) compressing the ring to produce a thermoelectric component.

The method is preferably performed in the sequence a) to c), in particular in succession in the sequence a) to d), wherein in particular, steps a), b) and c) may be performed multiple times and/or in parallel with one another. In particular, the method includes further steps in between, for example for the handling of the fiber, of the coated fiber and/or of the ring.

The fiber has, in particular, at least one of the following characteristics: elongate, filiform, flexible, preferably circular cross section, length preferably at least 100 times greater than the diameter of the fiber, diameter at least 0.5 micrometers and diameter at most 5 micrometers. In particular, the method encompasses the use of precisely one, but preferably multiple, fiber(s) for producing a thermoelectric component.

The at least one fiber is composed preferably of a non-thermoelectric material, in particular of a ceramic material. In this case, the following materials, in particular, are proposed, which may be used individually or in combination with one another: aluminum oxide, zirconium oxide.

In particular, in step b), use is made of a thermoelectric material which has at least one of the following materials:

| Type: | Material: |
|---|---|
| V-VI | $Bi_2Te_3$ |
| IV-VI | PbTe |
| $Zn_4Sb_3$ | $Zn_4Sb_3$ |
| Silicides | $p\text{-}MnSi_{1.73}$ |
| | $n\text{-}Mg_2Si_{0.4}Sn_{0.6}$ |
| | $Si_{0.80}Ge_{0.20}$ |
| | $Si_{0.94}Ge_{0.06}$ |
| Skutterudite | $CoSb3$ |
| Semi-Heusler | TiNiSn |
| n/p-clathrates | $Ba_8Ga_{16}Ge_{30}$ |
| Oxides | $p\text{-}NaCo_2O_4$ |
| Zintl phases | $p\text{-}Yb_{14}MnSb_{11}$ |
| $Th_3P_4$ | $La_{3\text{-}X}Te_4$ |

In one particularly advantageous embodiment, the at least one fiber is constructed to be coordinated with the thermoelectric material with regard to at least one material characteristic. In particular, at least in a temperature range from 150° C. to 600° C., the coefficients of thermal expansion of the fiber and of the thermoelectric material correspond to one another and differ from one another preferably by at most 10%, in particular only by at most 2%.

It is preferable for the at least one fiber to have the following material characteristics:

The material of the fiber exhibits higher strength than the thermoelectric material;

Tensile strength of the material of the fiber is greater than 100 N/mm² [newtons per square millimeter];

Compressive strength of the material of the fiber is greater than 500 N/mm².

The coating of the at least one fiber with the thermoelectric material is preferably performed by deposition of the thermoelectric material on the fiber, for example by using CVD (chemical vapor deposition) or PVD (physical vapor deposition) methods. Other methods may, however, also be used for the coating step.

It is preferable for the at least one coated fiber to be wound to form a ring with a central axis, in such a way that the at least one coated fiber is coiled around the central axis. In particular, the at least one fiber is additionally folded. In particular, the ring has an inner diameter and an outer diameter. In particular, by using the method, a (cylindrical) disk element is produced which thus does not have an inner diameter (that is to say a ring with an inner diameter of 0 mm).

The optionally proposed compression of the ring or of the at least one coated fiber is performed, in particular, at a temperature of at least 250° C. [degrees Celsius], with a pressure of at least 2 bar preferably being applied for the purpose of producing a ring. Temperatures of greater than 500° C. and pressures of at least 2.5 bar are preferable.

It is duly possible, for the production of the thermoelectric component, for further thermoelectric material in addition to the thermoelectric material for coating the fiber to also be added, in particular in or after step c), in such a way that the thermoelectric component is composed not only of (compressed) coated fiber but the ring is additionally formed from thermoelectric material. The thermoelectric component is, however, preferably formed exclusively by the at least one coated fiber.

In accordance with another particularly advantageous mode of the invention, the thermoelectric component produced after step d) has a first extent along an axial direction and, in a step d1), is divided, by using a separation process (for example sawing), into multiple (at least two) rings each with a smaller, second extent in the axial direction.

The first extent is, in particular, at least 2 mm, preferably at least 10 mm. The second extent is correspondingly at least 1.0 mm.

In particular, it is also possible, after step c), for a step c1) to be performed in which the ring produced in step c) is divided, by using a separation process, into multiple (at least two) rings. Correspondingly, the thermoelectric components produced after step d) would then undergo no further separation. In particular, in the case of a disk element produced by using the method, an inner diameter is introduced in a further step. This step preferably follows step c), c1) or d).

In particular, the at least one coated fiber extends, in a circumferential direction of the produced thermoelectric component, over an angle range of at least 120° [(angular) degrees], preferably of at least 360° and particularly preferably of at least 420°. In particular, at least two coated fibers overlap in the circumferential direction over an angle range of at least 5°. It is thereby ensured that the thermoelectric component has the advantageous material characteristics generated by the fiber.

With the objects of the invention in view, there is also provided a thermoelectric component, comprising at least one fiber coated with thermoelectric material, wherein the thermoelectric component has an annular form and the at least one coated fiber extends, in a circumferential direction, over an angle range of at least 120°, preferably of at least 360° and particularly preferably of at least 420°. In particular, the thermoelectric component is produced in accordance with the method according to the invention.

It is preferable for non-thermoelectric material to make up 20 to 80 wt %, in particular 35 to 65 wt %, of the thermoelectric component.

In one advantageous embodiment of the thermoelectric component, the non-thermoelectric material has, in a temperature range from 20° C. to 600° C., at least one characteristic from the following group:
greater tensile strength $R_m$ and/or yield strength $R_{p0.2}$ than the thermoelectric material,
lower specific thermal conductivity [watt/(kelvin*meters)] than the thermoelectric material,
lower electrical conductivity [amperes/(volts*meters)] than the thermoelectric material.

It is furthermore preferable for multiple or all of the characteristics to be present.

The characteristic assists in the realization of the desired functions of the thermoelectric component, such as for example the improvement of the tensile strength, a (possibly locally predefined or adapted) thermal conductivity and/or an adapted electrical conductivity, wherein the latter characteristics can be used, in particular, to improve the efficiency of the thermoelectric component.

It is provided, in particular, that the non-thermoelectric material in this case is disposed as a thermal insulation material within the thermoelectric component.

It is provided, in particular, that the non-thermoelectric material is not used as an electrical conductor, that is to say in this case does not perform a function of the thermoelectric material (Seebeck/Peltier effect). In particular, the thermoelectric effect is realized exclusively by using the thermoelectric material in the thermoelectric component.

In particular, the use of the non-thermoelectric material within the thermoelectric component makes it possible for the thermal conductivity of a thermoelectric module constructed with corresponding thermoelectric components to be set, at one operating point, in such a way that between 20% and 80%, in particular between 35% and 65%, of the overall temperature difference (between an exhaust gas and a coolant) prevails across the thermoelectric module, that is to say between a hot side and a cold side. In this connection, reference is made to German Patent Application DE 10 2010 030 259 A1, the entire content of which is referred to and incorporated herein for explanation of the technical circumstances. The references to "foreign material" in the document relate in this case to the "non-thermoelectric material."

The method proposed herein and the thermoelectric component are distinguished by the special configuration of a fiber coated with thermoelectric material. Through the use of the fiber, composed in particular of ceramic material, the mechanical strength and durability with regard to fluctuating thermal loads are increased considerably, in such a way that durable thermoelectric modules can be provided. In particular, forces in the circumferential direction of the rings are absorbed by using the at least one fiber. It is preferably the case that creep of the thermoelectric material is reduced or even prevented entirely in this way.

With the objects of the invention in view, there is concomitantly provided a motor vehicle, comprising at least an internal combustion engine, an exhaust system and a thermoelectric module, wherein the thermoelectric module has at least one thermoelectric component according to the invention or at least one thermoelectric component produced in accordance with the method according to the invention. The thermoelectric module is constructed to generate electrical energy from the thermal energy of an exhaust gas.

Other features which are considered as characteristic for the invention are set forth in the appended claims, noting that the features specified individually in the claims may be combined with one another in any desired technologically expedient manner and form further embodiments of the invention. The description, in particular in conjunction with the figures, explains the invention further and specifies supplementary exemplary embodiments of the invention. It is also pointed out that the use of the thermoelectric component proposed herein is not restricted to motor vehicles. Where technologically meaningful, the statements herein relating to the method according to the invention apply correspondingly to the thermoelectric component according to the invention.

Although the invention is illustrated and described herein as embodied in a method for producing a thermoelectric component, a thermoelectric component and a motor vehicle, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIG. 1 is a diagrammatic, perspective view of a fiber according to step a) of the method;

FIG. 2 is a perspective view of a coated fiber according to step b) of the method;

FIG. 3 is a plan view of a wound, coated fiber according to step c) of the method;

FIG. 4 is a side-elevational view of a wound, coated fiber according to step c) of the method;

FIG. 5 is a longitudinal-sectional view of a thermoelectric component according to step d) of the method;

FIG. 6 is a longitudinal-sectional view of a thermoelectric component according to step d1) of the method.

DETAILED DESCRIPTION OF THE INVENTION

Figure 7:
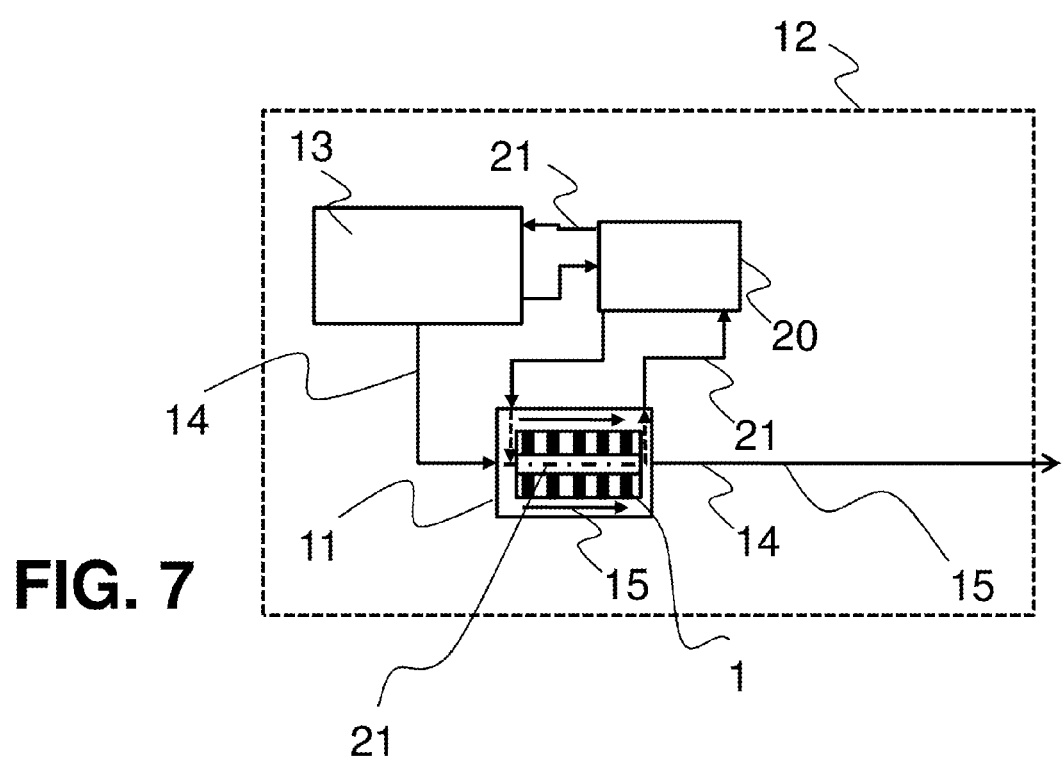
FIG. 7 is a block diagram of a motor vehicle.

Referring now in detail to the figures of the drawing for explaining the invention and the technical field in more detail by showing particularly preferred structural variants to which the invention is not restricted and in which the same reference numerals are used to denote identical objects, and first, particularly, to FIG. 1 thereof, there is seen a fiber 2 provided according to step a) of the method for producing a thermoelectric component 1.

FIG. 2 shows a coated fiber 4 that has been produced according to step b) of the method, wherein the fiber 2 has been coated with a thermoelectric material 3.

FIG. 3 shows a wound, coated fiber 4 according to step c) of the method. In this case, the wound, coated fiber 4 is shown in a plan view. The coated fiber 4 has been wound to form a ring 5, so that the coated fiber 4 extends, in a circumferential direction 9, over an angle range 10.

FIG. 4 shows the wound, coated fiber 4 according to step c) of the method, in a side view. The coated fiber 4 has been wound around a central axis 6 to form a ring 5.

FIG. 5 shows the thermoelectric component 1 that has been produced in accordance with step d) of the method. The ring 5 with the central axis 6 is compressed in a device or press 18, by way of at least one pressing force 17, to form a thermoelectric component 1. In the illustrated longitudinal section of the thermoelectric component 1, the fibers 2 of the coated fibers 4 can be seen.

FIG. 6 shows a thermoelectric component 1 after step d1) of the method. In this case, a thermoelectric component 1 which is provided in the form of a ring 5 and which extends along an axial direction 8 over a first extent 7 is divided, by way of a separation 19, into two thermoelectric components 1. Following the separation 19, the thermoelectric components 1 each have a smaller, second extent 16. The thermoelectric component has an inner diameter 22 and an outer diameter 23.

FIG. 7 shows a motor vehicle 12 having an internal combustion engine 13 and an exhaust system 14, in which a thermoelectric module 11 is disposed in the exhaust system 14. Exhaust gas 15 flows from the internal combustion engine 13, through the exhaust system 14 and the thermoelectric module 11, into the environment. A cooling configuration or cooler 20 is connected to the internal combustion engine 13 and to the thermoelectric module 11 for cooling purposes. A cold medium 21 flows from the cooling configuration 20 to the thermoelectric module 11. The thermoelectric module 11 has a tubular form or shape and has annular thermoelectric components 1 which are disposed in series along an axial direction. The thermoelectric module 11 has, in an inner duct, a cold side through which the cold medium 21 flows. A hot side in this case is disposed on the outer surface. The outer surface of the thermoelectric module 11 is exposed to the exhaust gas 15. A temperature potential is correspondingly generated across the thermoelectric module 11 between the exhaust gas 15 and the cold medium 21, in such a way that an electrical current is generated by the thermoelectric components 1.

The invention claimed is:

1. A method for producing a thermoelectric component, the method comprising the following steps:
    a) providing at least one fiber;
    b) coating the at least one fiber with a thermoelectric material to form at least one coated fiber;
    c) at least winding the at least one coated fiber to form a ring with a central axis, the at least one coated fiber extending in a circumferential direction over an angle range of at least 120°; and
    d) compressing the ring to produce a thermoelectric component defining a tube having and inner diameter and an outer diameter.

2. The method according to claim 1, which further comprises:
    providing the thermoelectric component produced in step d) with a first extent along an axial direction; and
    d1) dividing the thermoelectric component, in a separation process, into a plurality of thermoelectric components each having a second extent in the axial direction being smaller than the first extent.

3. The method according to claim 1, wherein the at least one coated fiber extends, in a circumferential direction of the thermoelectric component, over an angle range of at least 120°.

4. The method according to claim 1, wherein the at least one fiber is composed of a ceramic material.

5. An annular thermoelectric component, comprising:
    at least one fiber wound in a ring extending in a circumferential direction over an angle range of at least 120°, said at least one fiber defining a tube having and inner diameter and an outer diameter; and a thermoelectric material coating said at least one fiber.

6. A motor vehicle, comprising:

an internal combustion engine;

an exhaust system receiving exhaust gas from said internal combustion engine; and a thermoelectric module disposed in said exhaust system, said thermoelectric module constructed to generate electrical energy from thermal energy of the exhaust gas, and said thermoelectric module having at least one thermoelectric component including:

at least one fiber wound in a ring extending in a circumferential direction over an angle range of at least 120°; and a thermoelectric material coating said at least one fiber.

* * * * *